United States Patent
Miyagawa et al.

(10) Patent No.: US 7,453,141 B2
(45) Date of Patent: Nov. 18, 2008

(54) SEMICONDUCTOR DEVICE PACKAGE, METHOD OF MANUFACTURING THE SAME, AND SEMICONDUCTOR DEVICE

(75) Inventors: Hiroshi Miyagawa, Nagano (JP); Mitsuhiro Otagiri, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 303 days.

(21) Appl. No.: 11/354,361

(22) Filed: Feb. 15, 2006

(65) Prior Publication Data
US 2006/0189178 A1    Aug. 24, 2006

(30) Foreign Application Priority Data
Feb. 18, 2005    (JP)    ............... 2005-042639

(51) Int. Cl.
*H01L 23/06* (2006.01)
*H01L 23/04* (2006.01)
(52) U.S. Cl. .............. 257/678; 257/684; 257/698; 257/737; 257/774; 438/106; 438/121; 438/613; 438/637; 438/639; 438/640
(58) Field of Classification Search ............. 257/684, 257/678, 698, 737, 774; 438/106, 121, 613, 438/629, 637, 639, 640
See application file for complete search history.

(56) References Cited

U.S. PATENT DOCUMENTS 5,583,378 A * 12/1996 Marrs et al. ............ 257/710
5,825,084 A 10/1998 Lau et al.
6,005,289 A * 12/1999 Watanabe et al. ............ 257/700
6,232,551 B1 5/2001 Chang
2001/0038905 A1 11/2001 Takada et al.

FOREIGN PATENT DOCUMENTS

| DE | 102 01 782 | 3/2003 |
|---|---|---|
| JP | 4-348591 | 12/1992 |
| JP | 10-92972 | 4/1998 |

* cited by examiner

*Primary Examiner*—Kenneth Parker
*Assistant Examiner*—Joseph Nguyen
(74) *Attorney, Agent, or Firm*—Rankin, Hill & Clark LLP (57) ABSTRACT

A semiconductor device package is provided which can achieve speeding-up thereof. The semiconductor device package includes: a board which has at least one of a ground plane and a power plane; at least one connecting conductor portion which is formed on an inner wall surface of an opening portion of the board and electrically connected to the corresponding plane; at least one bonding pattern which is formed on a front surface layer portion of the board in the vicinity of an edge of the opening portion, and connected to the corresponding connecting conductor portion; and a second external connection portion which is formed on the side of the front surface layer of the board, and electrically connected to the corresponding plane, respectively, through a through-hole conductor portion formed in the board.

8 Claims, 11 Drawing Sheets

SEMICONDUCTOR DEVICE PACKAGE, METHOD OF MANUFACTURING THE SAME, AND SEMICONDUCTOR DEVICE

This application claims foreign priority based on Japanese Patent application No. 2005-042639, filed Feb. 18, 2005, the contents of which is incorporated herein by reference in its entirety.

BACKGROUND OF THE INVENTION

1. Field of the Invention

The present invention relates to a semiconductor device package, a method of manufacturing the same, and a semiconductor device.

2. Description of the Related Art

JP-A-10-92972 discloses a package for what is called a BOC (Board-on-Chip). This BOC package is mainly mounted with a semiconductor chip used for a memory. In JP-A-10-92972, a predetermined wiring pattern and an external connection portion for connecting the wiring pattern externally are formed on the side of a front surface layer of a print-circuit board. An opening portion is formed in a central portion of the board, a terminal portion of the semiconductor chip mounted on the side of a back surface of the board faces the opening portion, and wires electrically connect the terminal portion and the wiring pattern on the side of the front surface layer through the opening portion.

In recent years, there has been a demand for the speeding-up of semiconductor devices. Internal layers such as a ground plane and a power plane are required even in the memory packages.

SUMMARY OF THE INVENTION

An object of the invention is to provide a semiconductor device package, a method of manufacturing the same, and a semiconductor device, enabled to achieve the speeding-up of the semiconductor device.

In some implementations, a semiconductor device package of the invention comprises: a board including at least one of a ground plane and a power plane; a wiring pattern which is formed on a side of a front surface of the board; a first external connection portion connecting the wiring pattern externally which is formed on the front surface side of the board; an opening portion formed in the board; at least one connecting conductor portion which is formed on an inner wall of the opening portion, and electrically connected to the corresponding one of the at least one of the ground plane and the power plane; at least one bonding pattern which is formed on the front surface side of the board, and connected to the corresponding connecting conductor portion; and a second external connection portion which is formed on the front surface side of the board, and electrically connected to the corresponding one of the at least one of the ground plane and the power plane through a through-hole conductor portion formed in the board.

The semiconductor device package of the invention further comprises: a concave groove formed in the inner wall of the opening portion, wherein the connecting conductor portion is formed on a wall surface of the concave groove.

The semiconductor device package of the invention further comprises: bumps formed on the first external connection portion and the second external connection portion.

In the semiconductor device package of the invention, the at least one of the ground plane and the power plane is formed in an internal layer of the board.

In the semiconductor device package of the invention, one of the ground plane and the power plane is formed on a side of a back surface of the board.

The semiconductor device package of the invention further comprises: a concave groove formed in the inner wall of the opening portion, wherein the connecting conductor portion is formed on the inner wall of the opening portion where the concave groove is not formed.

In the semiconductor device package of the invention, the at least one connecting conductor portion comprises a plurality of connecting conductor portions respectively and electrically connected to the corresponding one of the at least one of the ground plane and the power plane.

In some implementations, a semiconductor device of the invention including the semiconductor device package comprises: a semiconductor chip mounted on a side of a back surface of the board, the semiconductor chip having a first terminal portion and a second terminal portion both facing the opening portion; a first wire for electrically connecting the wiring pattern and the first terminal portion through the opening portion; and a second wire for electrically connecting the bonding pattern and the second terminal portion through the opening portion.

In the semiconductor device of the invention, the semiconductor chip, the first wire and the second wire are sealed with a sealing resin.

In some implementations, a method of manufacturing a semiconductor device package of the invention comprises: forming a board which has at least one of a ground plane and a power plane, and also has a conductor layer on a side of its front surface; forming a first through-hole at a position of the board that corresponds to an opening edge of an opening portion to be formed, an end surface of the at least one of the ground plane and the power plane being exposed on an inner wall of the first through-hole; forming a second through-hole at a part of the board other than a part where the opening portion is to be formed, an end surface of the at least one of the ground plane and the power plane being exposed on an inner wall of the second through-hole; forming a plating film on the board entirely, the plating film formed on the inner walls of the first through-hole and the second through-hole serving as conductor portions that are electrically connected to the end surfaces of the at least one of the ground plane and the power plane, respectively; performing etching on the plating film and the conductor layer of the board to form a wiring pattern, a first external connection portion connecting the wiring pattern externally, a second external connection portion connected to the conductor portion formed on the inner wall of the second through-hole, and a bonding pattern connected to the conductor portion which is formed on the inner wall of the first through-hole; and forming the opening portion in the board, an outline of the opening portion crossing the first through-hole.

In the method of manufacturing the semiconductor device package of the invention, the first through-hole and the second through-hole are formed in a same process.

The method of manufacturing the semiconductor device package of the invention further comprises: forming bumps on the first external connection portion and the second external connection portion.

In the method of manufacturing the semiconductor device package of the invention, the at least one of the ground plane and the power plane is formed in an internal layer of the board.

In the method of manufacturing the semiconductor device package of the invention, one of the ground plane and the power plane is formed on a side of a back surface of the board.

In some implementations, a method of manufacturing a semiconductor device package of the invention comprises: forming a board which has at least one of a ground plane and a power plane, and also has a conductor layer on a side of its front surface; forming an opening portion in the board, an end surface of the at least one of the ground plane and the power plane being exposed on an inner wall of the opening portion; forming a through-hole at a part of the board other than a part where the opening portion is formed, an end surface of the at least one of the ground plane and the power plane being exposed on an inner wall of the through-hole; forming a plating film on the board entirely, the plating film formed on the inner walls of the opening portion and the through-hole serving conductor portions that are electrically connected to the end surfaces of the at least one of the ground plane and the power plane, respectively; performing etching on the plating film and the conductor layer of the board to form a wiring pattern, a first external connection portion connecting the wiring pattern externally, a second external connection portion connected to the conductor portion formed on the inner wall of the through-hole, and a bonding pattern connected to the conductor portion which is formed on the inner wall of the opening portion.

The method of manufacturing the semiconductor device package of the invention further comprises: removing a part of the conductor portion formed on the inner wall of the opening portion so that the conductor portion is divided into a plurality of the conductor portions which are separate from each other.

The method of manufacturing the semiconductor device package of the invention further comprises: forming bumps on the first external connection portion and the second external connection portion.

In the method of manufacturing the semiconductor device package of the invention, the at least one of the ground plane and the power plane is formed in an internal layer of the board.

In the method of manufacturing the semiconductor device package of the invention, one of the ground plane and the power plane is formed on a side of a back surface of the board.

The method of manufacturing the semiconductor device package of the invention further comprises: forming a concave groove in the inner wall of the opening portion.

DESCRIPTION OF THE PRFERRED EMBODIMENTS

Hereunder, embodiments of the present invention are described in detail.

Referring to FIGS. 1 to 9B, a first embodiment of the present invention is described.

Figure 1:
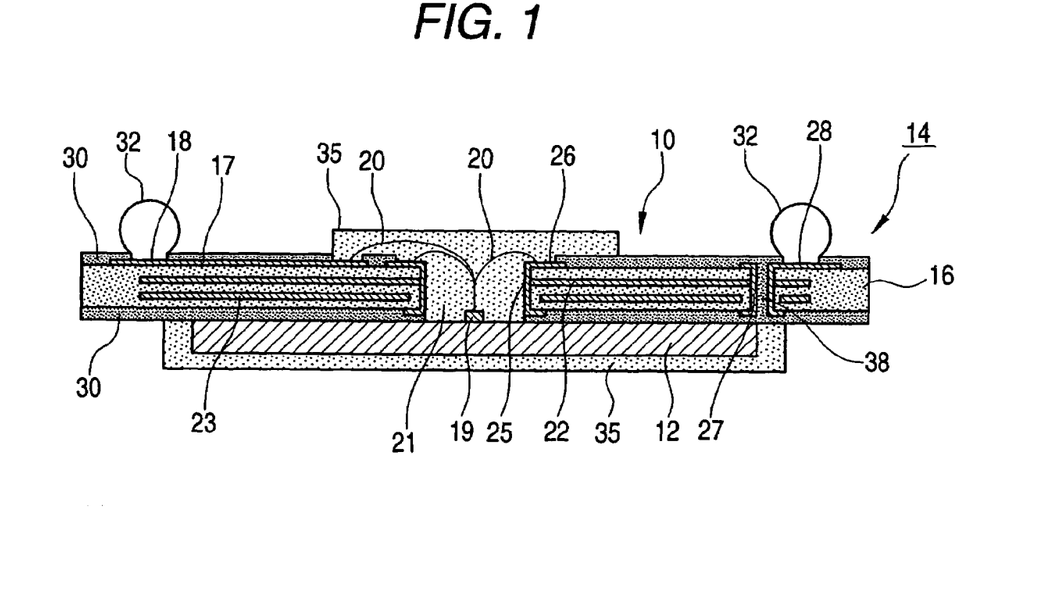
FIG. 1 is an explanatory cross-sectional view illustrating a semiconductor device according to a first embodiment.
Figure 2:
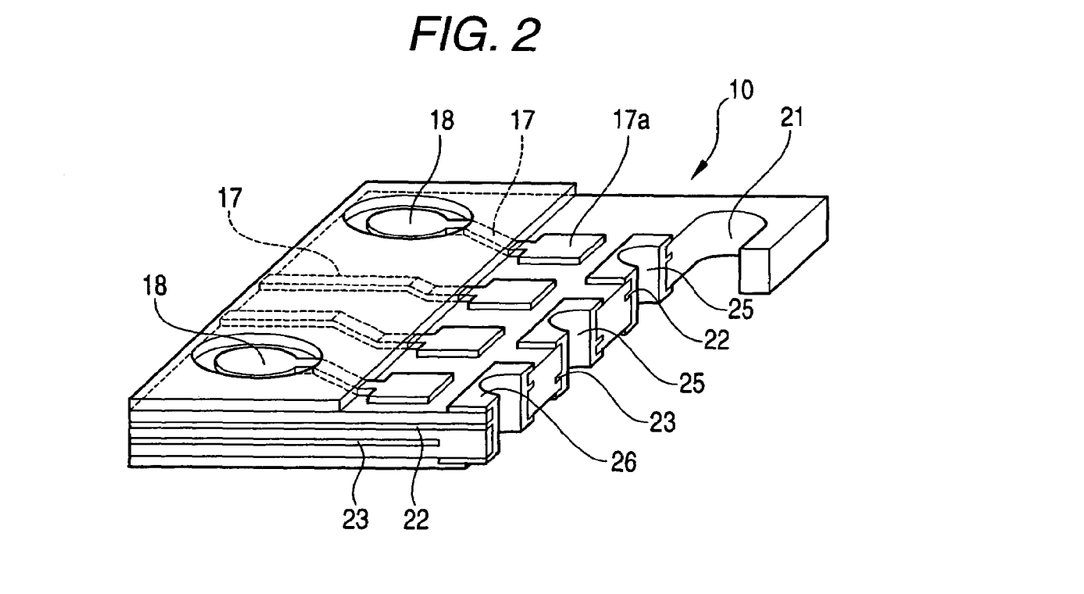
FIG. 2 is a partially cut away perspective view illustrating a semiconductor device package according to a first embodiment.

FIG. 1 is a schematic explanatory cross-sectional view illustrating a semiconductor device 14, in which a semiconductor chip 12 is mounted on a semiconductor device package 10 for BOC. FIG. 2 is a partially cut away perspective view of the package 10.

The semiconductor device package 10 is the same as the related semiconductor device package in the following points: a wiring pattern 17 and a first external connection portion 18 for connecting the wiring pattern 17 externally are formed on the side of a front surface layer of a print-circuit board 16; and an opening portion 21 is formed in a central portion of the board 16, a terminal portion 19 of the semiconductor chip 12 mounted on the side of a back surface of the board 16 faces the opening portion 21, and wires 20 for electrically connecting the terminal portion 19 and the wiring pattern 17 on the side of the front surface layer through the opening portion 21.

Incidentally, the opening portion 21 may be provided in a part other than the central portion of the board 16, for example, a peripheral edge portion (not shown) of the board 16. Hereunder, a case in which the opening portion 21 is provided in the central portion of the board 16 is described by way of example.

The package 10 according to this embodiment is provided with: at least one of a ground plane 22 and a power plane 23 which are formed in an internal layer of the board 16; a plurality of connecting conductor portions 25 which is formed on an inner wall surface of the opening portion 21 of the board 16 and electrically connected to the corresponding planes 22 and 23, respectively; a plurality of the bonding patterns 26 which is formed on a front surface layer portion of the board 16 in the vicinity of an edge of the opening portion 21, and respectively connected to the corresponding connecting conductor portion 25; and a second external connection portion 28 which is formed on the side of the front surface layer of the board 16, and electrically connected to the corresponding planes 22 and 23, respectively, through a through-hole conductor portion 27 formed in the board 16.

Incidentally, a reference numeral 30 designates a solder resist film.

Also, anticorrosion plating film such as Ni/Au film may be formed on parts of the wiring pattern 17, the connecting conductor portion 25, etc., the parts of which are externally exposed.

Although both of the ground plane 22 and the power plane 23 are provided in the internal layer of the board 16 in the example shown in FIGS. 1 and 2, either one of the ground plane 22 and the power plane 23 may be provided therein. Further, in FIG. 1, a part of the semiconductor device 14 is cross-sectionally shown, where the ground plane 22 is electrically connected to the connecting conductor portion 25, and the ground plane 22 is connected to the second external connection portion 28 through the through-hole conductor portion 27. Also, the power plane 23 is electrically connected to the connecting conductor portion 25 provided at another part of the inner wall surface of the opening portion 21 (see FIG. 2), and is connected to the second external connection portion 28 provided at another part, through the through-hole conductor portion 27 provided at another part. Incidentally, the second external connection portion 28 is not shown in FIG. 2.

Bumps 32, such as solder balls, are attached to the first external connection portion 18 and the second external connection portion 28.

Further, the connecting conductor portion 25 formed on the inner wall surface of the opening portion 21 is formed on a wall surface of a concave groove of which cross section is semicirclular shaped, the concave groove being formed on the inner wall surface of the opening portion 21 (see FIG. 2).

Also, the semiconductor chip 12 is mounted on the side of the back surface of the board 16 of the semiconductor device package 10. The wires 20 electrically connect between a part of the terminal portion 19 of the semiconductor chip 12, the terminal portion 19 facing the opening portion 21 of the board 16, and a bonding area 17a of the wiring pattern 17 formed on the side of the front surface layer of the board 16, and between a part of the terminal portion 19 of the semiconductor chip 12 and the corresponding bonding pattern 26, so as to make up the semiconductor device 14.

Incidentally, the semiconductor chip 12 and the wires 20 are sealed with a sealing resin 35.

Next, a method of manufacturing the package 10 is described below by referring to FIGS. 3A to 9B.

FIGS. 3A, 4A, 5A, 6A, 7A, 8A and 9A are cross-sectional views. FIGS. 3B, 4B, 5B, 6B, 7B, 8B and 9B are plan views (partial or overall).

Figure 3A:
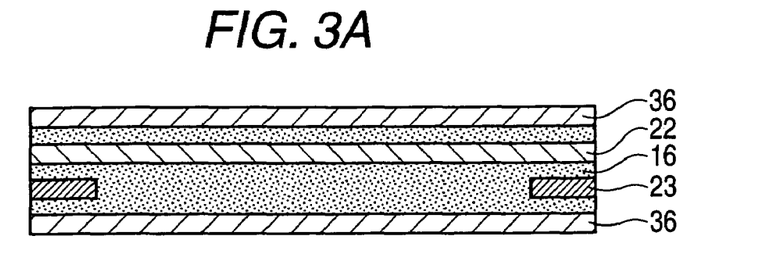
FIG. 3A is an explanatory cross-sectional view along the line A-A' illustrating a multilayer board in a manufacturing process of a semiconductor device package according to a first embodiment.
Figure 3B:
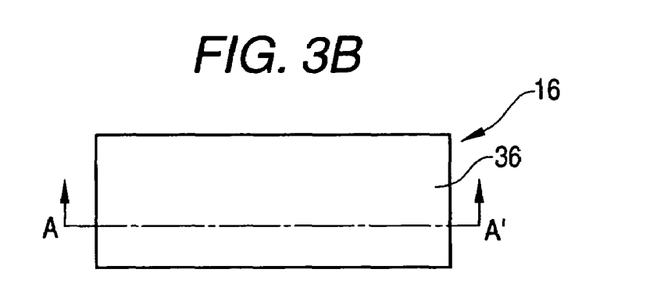
FIG. 3B is a partial plan view illustrating the multilayer board in FIG. 3A.

First, as shown in FIGS. 3A and 3B, a multilayer resin board 16 is formed or prepared, which has at least one of the ground plane 22 of a certain pattern and the power plane 23 of a certain pattern in the internal layer thereof, and also has a conductor layer 36 made of copper foil, etc., provided at least on the side of the front surface layer thereof. This multilayer board 16 shown in FIGS. 3A and 3B can be manufactured by an ordinary method of forming a multilayer print-circuit board.

Figure 4A:
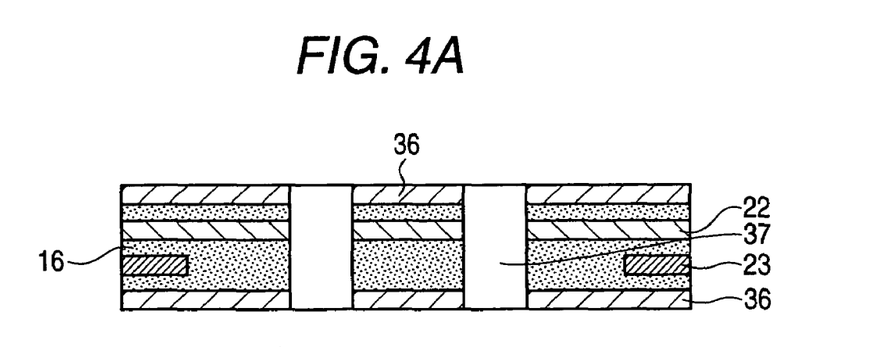
FIG. 4A is an explanatory cross-sectional view along the line B-B' illustrating a state in which a through-hole is formed in a board in a manufacturing process of a semiconductor device package according to a first embodiment.
Figure 4B:
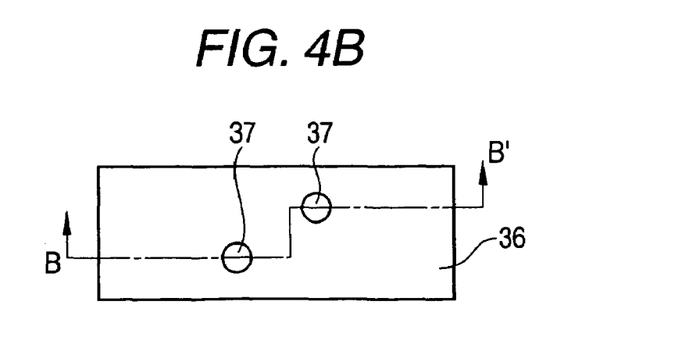
FIG. 4B is a partial plan view illustrating the state in FIG. 4A.

Subsequently, as shown in FIGS. 4A and 4B, a plurality of first through-holes 37 is formed at positions of the board 16 that correspond to an opening edge of the opening portion 21 to be formed. An end surface of the corresponding plane (the ground plane 22 in FIG. 4A) is exposed on an inner wall of the first through-hole 37. Also, an end surface of the power plane 23 is exposed on the inner wall of the first through-hole 37 provided at another part of the board 16.

Also, a second through-hole 38 (see FIG. 1) is formed at a part other than the part to be the opening portion 21 of the board 16. An end surface of the corresponding plane is exposed on an inner wall of the second through-hole 38. The formation of the first through-holes 37 and the second through-hole 38 can be performed in the same process by using a drill having an appropriate size.

Figure 5A:
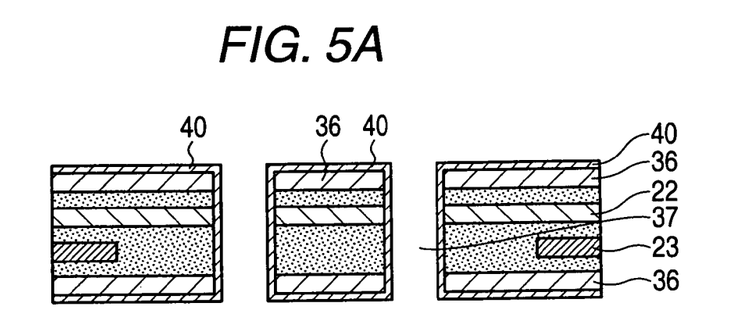
FIG. 5A is an explanatory cross-sectional view along the line C-C' illustrating a state in which plating is applied to a through-hole in a board in a manufacturing process of a semiconductor device package according to a first embodiment.
Figure 5B:
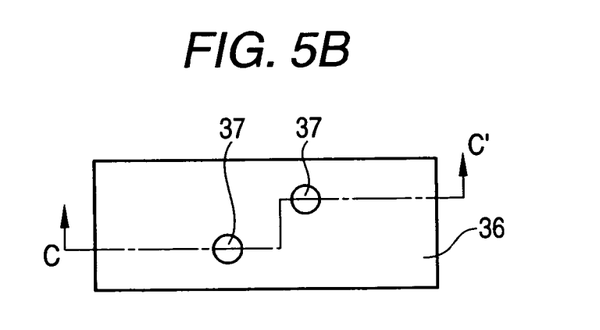
FIG. 5B is a partial plan view illustrating the state in FIG. 5B.

Next, as shown in FIGS. 5A and 5B, electroless copper plating is performed on the entire board 16 (on the inner walls of the first through-holes 37 and the second through-hole 38, and the conductor layer 36), and then, electrolytic copper plating is performed thereon so as to form a plating film 40 on the inner walls of the first through-holes 37 and the second through-hole 38 and the conductor layer 36. The plating film 40 on the inner walls of the first through-holes 37 and the second through-hole 38 serves as the conductor portions 25 and 27 (see FIG. 1). Then, the conductor portions 25 and 27 are respectively and electrically connected to end surfaces of the corresponding planes 22 and 23 exposed on the inner walls of the through-holes.

Figure 6A:
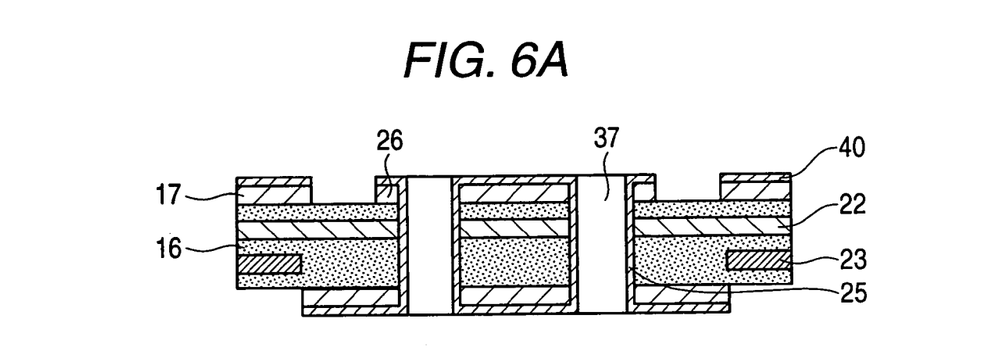
FIG. 6A is an explanatory cross-sectional view along the line D-D' illustrating a state in which a wiring pattern, etc., is formed by etching in a manufacturing process of a semiconductor device package according to a first embodiment.
Figure 6B:
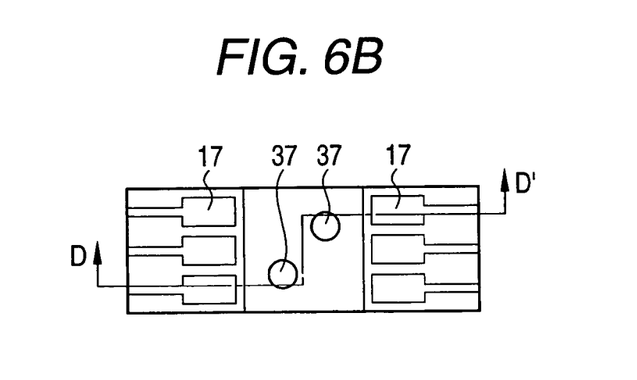
FIG. 6B is a partial plan view illustrating the state in FIG. 6A.

Then, as shown in FIGS. 6A and 6B, etching is performed on the plating film 40 and the conductor layer 36 of the board 16 in a photolithography process. Thus, the wiring pattern 17, the first external connection portion 18, the second external connection portion 28 connected to the conductor portion 27 which is formed on the inner wall of the second through-hole 38, and the bonding patterns 26 connected to the conductor portions 25 which are formed on the inner walls of the first through-holes 37, all of which are shown in FIGS. 1 and 2, are formed.

Figure 7A:
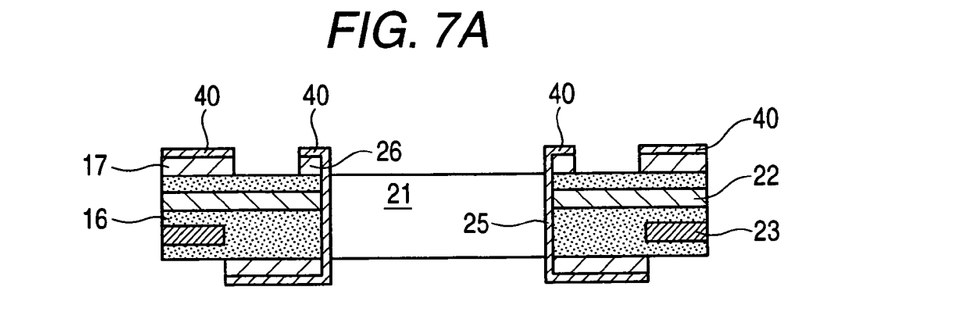
FIG. 7A is an explanatory cross-sectional view along the line E-E' illustrating a state in which an opening portion is formed in a manufacturing process of a semiconductor device package according to a first embodiment.
Figure 7B:
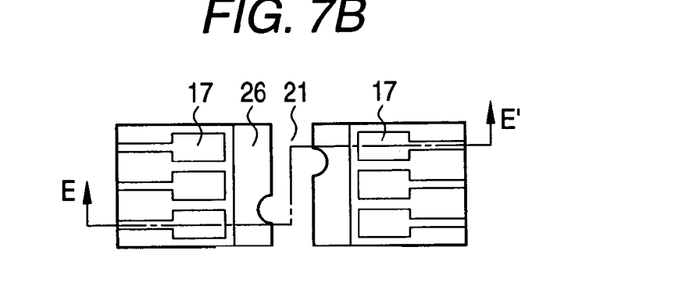
FIG. 7B is a partial plan view illustrating the state in FIG. 7A.

Subsequently, as shown in FIGS. 7A and 7B, the opening portion 21 is formed in the board 16 so that an outline of the opening portion 21 crosses the first through-holes 37 so as to make up the package 10. The opening portion 21 can be formed by cutting the board 16 using a cutting tool such as a router. Alternatively, the opening portion 21 can be formed by pressing and punching. Consequently, the conductor portions 25 are formed on the inner walls of the halved through-holes 37 (the concave groove of which cross section is semicirclular shaped).

Figure 8A:
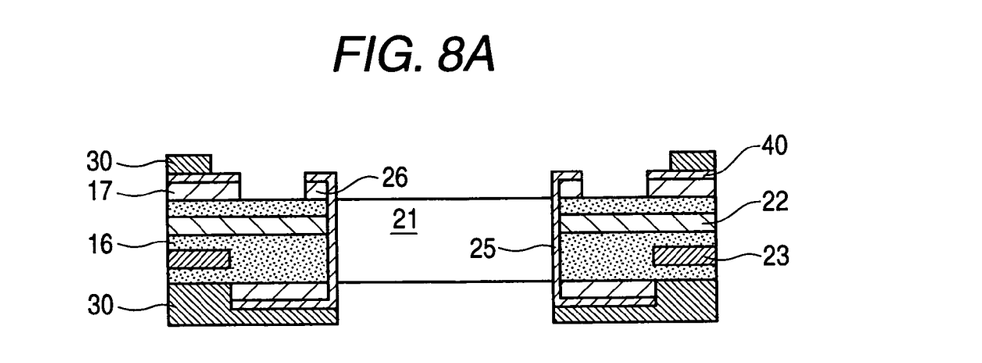
FIG. 8A is an explanatory cross-sectional view along the line F-F' illustrating a state in which a solder resist film is formed in a manufacturing process of a semiconductor device package according to a first embodiment.
Figure 8B:
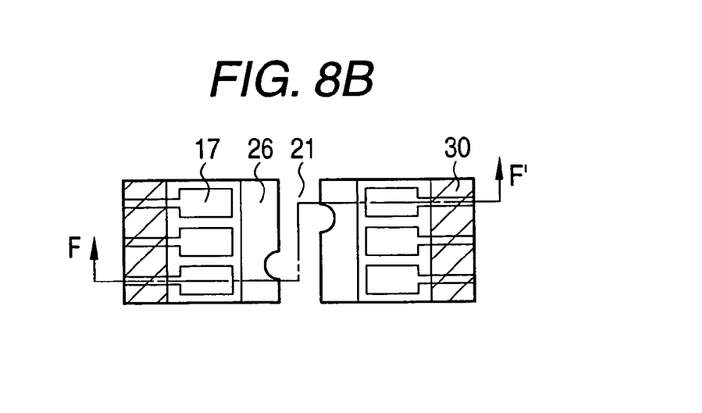
FIG. 8B is a partial plan view illustrating the state in FIG. 8A.

Then, as shown in FIGS. 8A and 8B, necessary parts of the front surface layer portion of the board 16 are coated with the solder resist film 30.

Figure 9A:
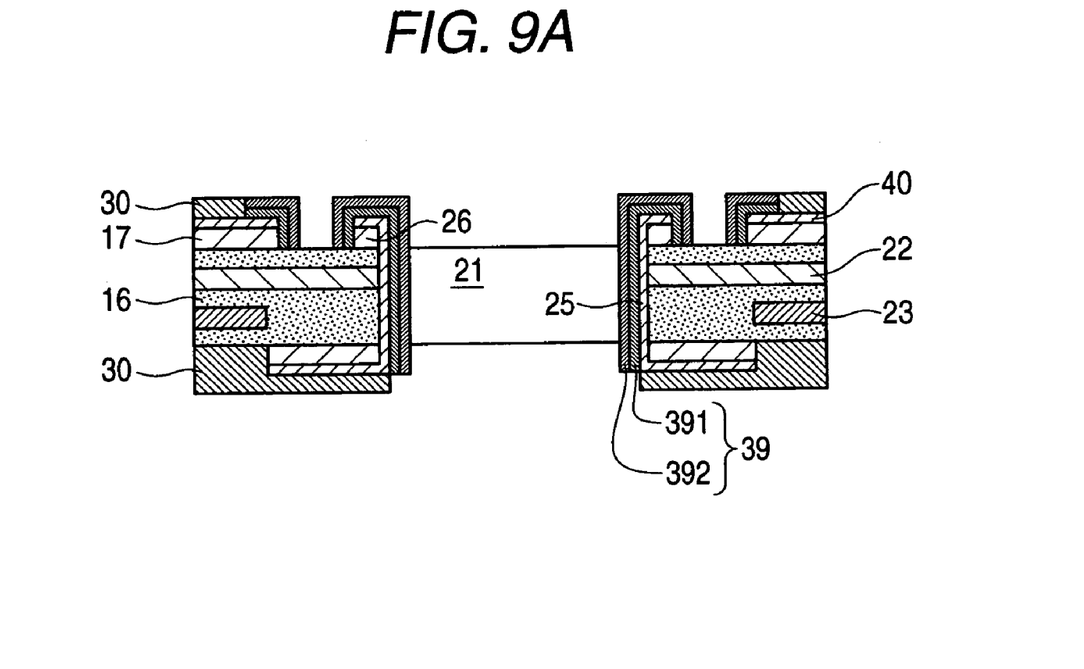
FIG. 9A is an explanatory cross-sectional view along the line G-G' illustrating a state in which anticorrosion plating film is formed on a connecting conductor portion, etc., in a manufacturing process of a semiconductor device package according to a first embodiment.
Figure 9B:
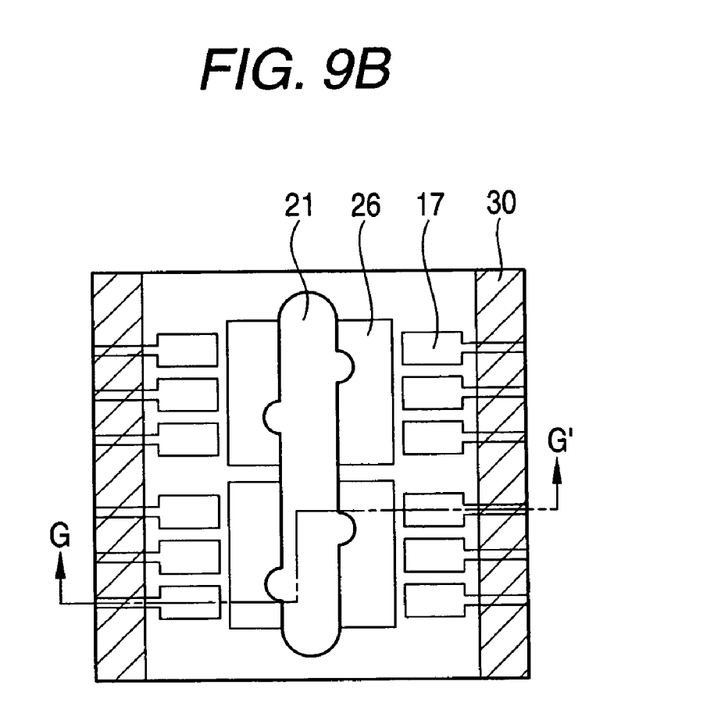
FIG. 9B is an overall plan view illustrating the state in FIG. 9A.

Also, as shown in FIGS. 9A and 9B, anticorrosion plating films 39, such as nickel plating film 391 and gold plating film 392, are formed on the wiring pattern 17, the first and the second external connection portions 18 and 28, and the conductor portions 25 and 27, which are externally exposed.

Further, the bumps 32, such as solder balls, are formed on the first and the second external connection portions 18 and 28.

Mainly referring to FIGS. 10 to 15B, a second embodiment of the present invention is described.

Figure 10:
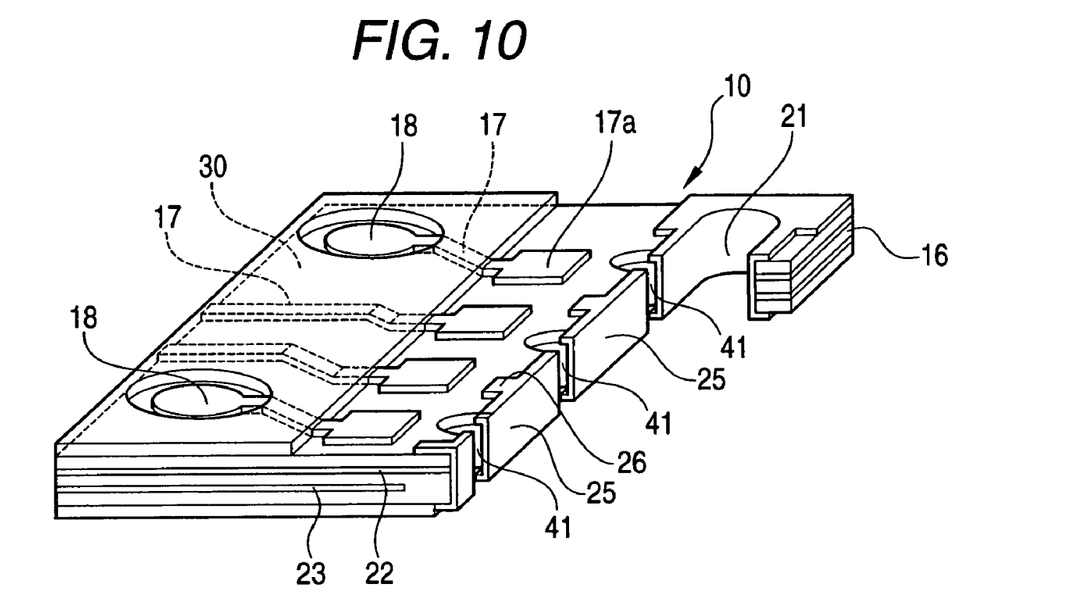
FIG. 10 is a partially cut away perspective view illustrating a semiconductor device package according to a second embodiment.

FIG. 10 is a partially cut away perspective view illustrating a second embodiment of a package 10. The same members as those of the first embodiment are designated by the same reference numerals.

Also, the package 10 according to the second embodiment is provided with: at least one of the ground plane 22 and the power plane 23 which are formed in the internal layer of the board 16; the plurality of the connecting conductor portions 25 which is formed on the inner wall surface of the opening portion 21 of the board 16 and electrically connected to the corresponding planes 22 and 23, respectively; the bonding pattern 26 which is formed on the front surface layer portion of the board 16 in the vicinity of the edge of the opening portion 21, and connected to the connecting conductor portion 25; and the second external connection portion 28 (not shown in FIG. 10) which is formed on the side of the front surface layer of the board 16, and electrically connected to the corresponding planes 22 and 23, respectively, through the through-hole conductor portion 27 (not shown in FIG. 10) formed in the board 16.

In the first embodiment, the first through-holes 37 are formed in a certain arrangement at the positions of the board 16 that correspond to the opening edge of the opening portion 21. Then, the conductor portions 25 are formed by plating, and the opening portion 21 is formed. However, in the second embodiment, the opening portion 21 is directly formed in the board 16 without providing the first through-holes 37. Then, a conductor portion is formed on the entire wall surface of this opening portion 21 by plating. Subsequently, unnecessary parts of the inner wall of the opening portion 21 are removed (concave grooves 41 are formed as shown in FIG. 10) by a cutting process, etc., so that a plurality of the conductor portions 25 which are separate from each other remain at necessary positions.

A manufacturing process of the package 10 according to the second embodiment is described below by referring to FIGS. 11A to 15B.

FIGS. 11A, 12A, 13A, 14A and 15A are cross-sectional views. FIGS. 11B, 12B, 13B, 14B and 15B are plan views (partial or overall).

Figure 11A:
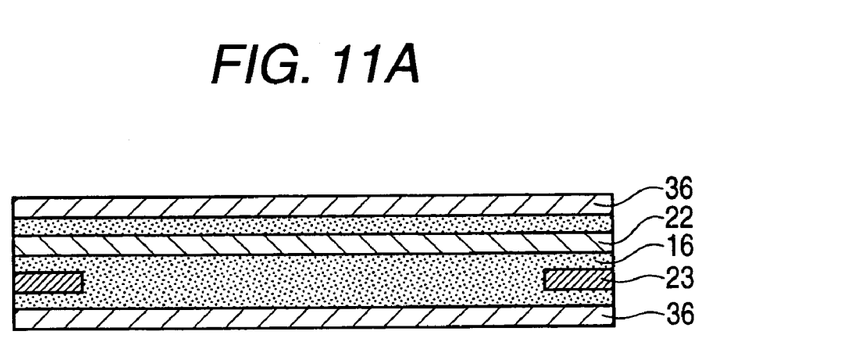
FIG. 11A is an explanatory cross-sectional view along the line H-H' illustrating a multilayer board in a manufacturing process of a semiconductor device package according to a second embodiment.
Figure 11B:
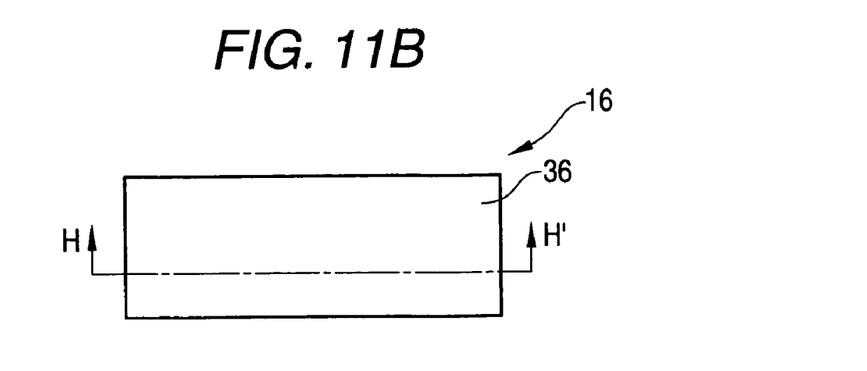
FIG. 11B is a partial plan view illustrating the multilayer board in FIG. 11A.

First, as shown in FIGS. 11A and 11B, the multilayer resin board 16 is formed or prepared, which has at least one of the ground plane 22 of a certain pattern and the power plane 23 of a certain pattern in the internal layer thereof, and also has the conductor layer 36 made of copper foil, etc., provided at least on the side of the front surface layer thereof. This multilayer board 16 shown in FIGS. 11A and 11B can be manufactured by an ordinary method of forming a multilayer print-circuit board.

Figure 12A:
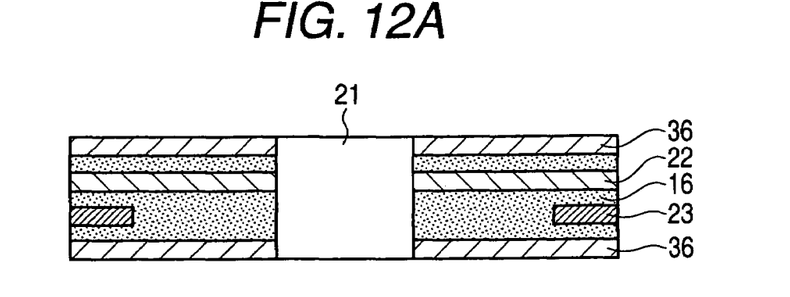
FIG. 12A is an explanatory cross-sectional view along the line I-I' illustrating a state in which an opening portion is formed in a board in a manufacturing process of a semiconductor device package according to a second embodiment.
Figure 12B:
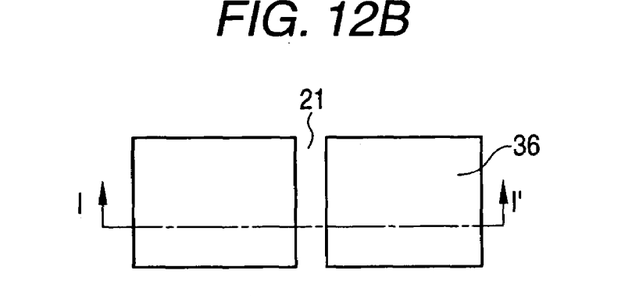
FIG. 12B is a partial plan view illustrating the state in FIG. 12A.

Subsequently, as shown in FIGS. 12A and 12B, the opening portion 21 is formed in the central portion of the board 16. Then, the end surface of the corresponding plane (the ground plane 22 in FIG. 12A) is exposed on the inner wall of the opening portion 21. Also, the end surface of the power plane 23 is exposed on the inner wall of the opening portion 21 at another part. The opening portion 21 can be formed by the cutting process using the cutting tool such as the router, and also by the pressing and punching process.

Also, the second through-hole 38 (see FIG. 1) is formed at a part other than the part to be the opening portion 21 of the board 16. An end surface of the corresponding plane is exposed on the inner wall of the second through-hole 38. The formation of the second through-hole 38 can be performed by using the drill having an appropriate size.

Next, the electroless copper plating is performed on the entire board 16 (on the inner wall of the opening portion 21, the inner wall of the second through-hole 38 and the conductor layer 36), and then, the electrolytic copper plating is performed thereon so as to form the plating film 40 on the inner wall of the opening portion 21, the inner wall of the second through-hole 38 and the conductor layer 36. The plating film 40 on the inner wall of the opening portion 21 and the inner wall of the second through-hole 38 serves as the conductor portions 25 and 27 (see FIG. 1). Then, the conductor portions 25 and 27 are respectively and electrically connected to the end surfaces of the corresponding planes 22 and 23 exposed on the inner wall of the opening portion 21 and the inner wall of the second through-hole 38.

Figure 13A:
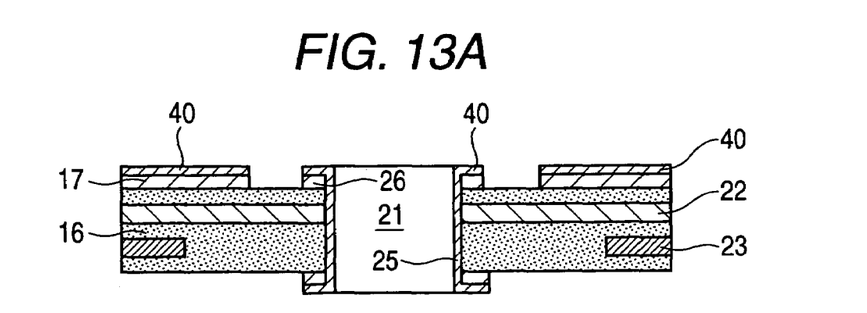
FIG. 13A is an explanatory cross-sectional view along the line J-J' illustrating a state in which a wiring pattern, etc., is formed by etching in a manufacturing process of a semiconductor device package according to a second embodiment.
Figure 13B:
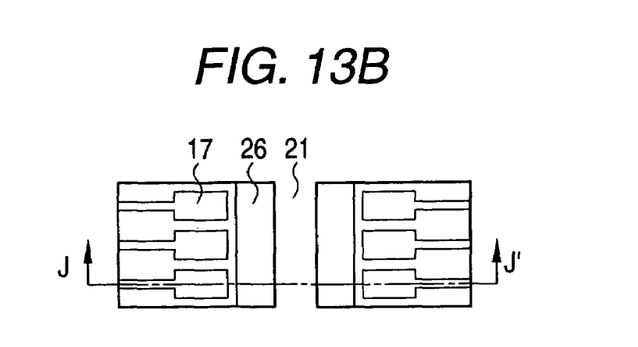
FIG. 13B is a partial plan view illustrating the state in FIG. 13A.

Then, as shown in FIGS. 13A and 13B, the etching is performed on the plating film 40 and the conductor layer 36 of the board 16 in the photolithography process. Thus, the wiring pattern 17, the first external connection portion 18, the second external connection portion 28 connected to the conductor portion 27 which is formed on the inner wall of the second through-hole 38, and the bonding patterns 26 connected to the conductor portion 25 which is formed on the inner wall of the opening portion 21, all of which are shown in FIGS. 1 and 10, are formed.

Figure 14A:
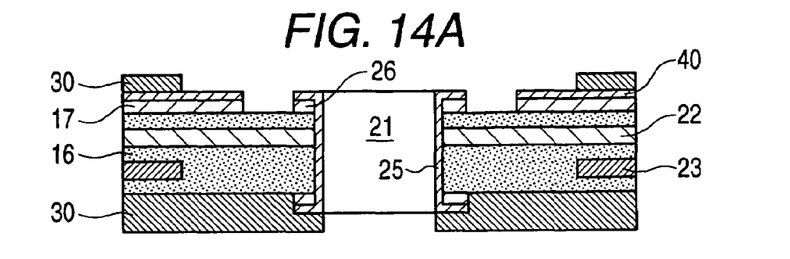
FIG. 14A is an explanatory cross-sectional view along the line K-K' illustrating a state in which a solder resist film is formed in a manufacturing process of a semiconductor device package according to a second embodiment.
Figure 14B:
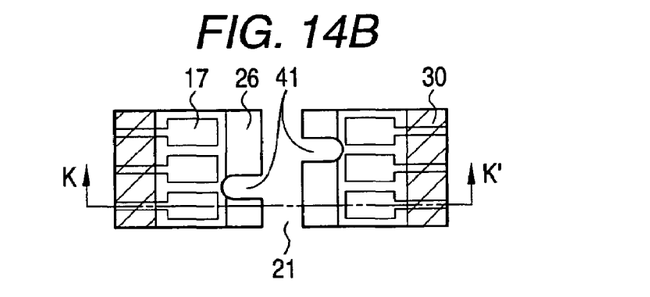
FIG. 14B is a partial plan view illustrating the state in FIG. 14A.

Subsequently, as shown in FIGS. 10, 14A and 14B, certain parts of the inner wall of the opening portion 21 are cut (the concave grooves 41 are formed) by the cutting tool such as the router to divide the conductor portion 25 formed on the inner wall of the opening portion 21 into a plurality of the conductor portions 25 which are separate from each other.

Also, as shown in FIGS. 14A and 14B, necessary parts of the front surface layer of the board 16 are coated with the solder resist film 30.

Figure 15A:
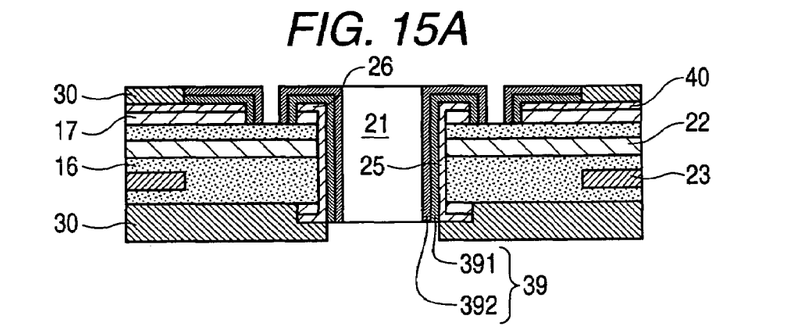
FIG. 15A is an explanatory cross-sectional view along the line L-L' illustrating a state in which anticorrosion plating film is formed on a connecting conductor portion, etc., in a manufacturing process of a semiconductor device package according to a second embodiment.
Figure 15B:
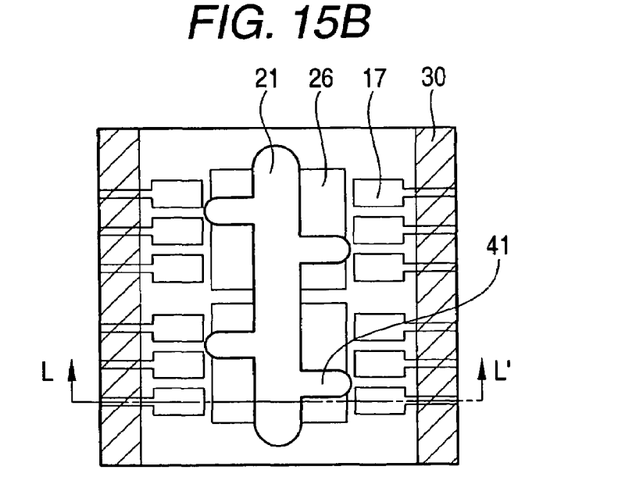
FIG. 15B is an overall plan view illustrating the state in FIG. 15A.

Also, as shown in FIGS. 15A and 15B, the anticorrosion plating films 39, such as the nickel plating film 391 and the gold plating film 392, are formed on the wiring pattern 17, the first and the second external connection portions 18 and 28, and the conductor portions 25 and 27, which are externally exposed.

Further, the bumps 32, such as the solder balls, are formed on the first and the second external connection portions 18 and 28.

Thus, the package 10 can be manufactured.

Figure 16:
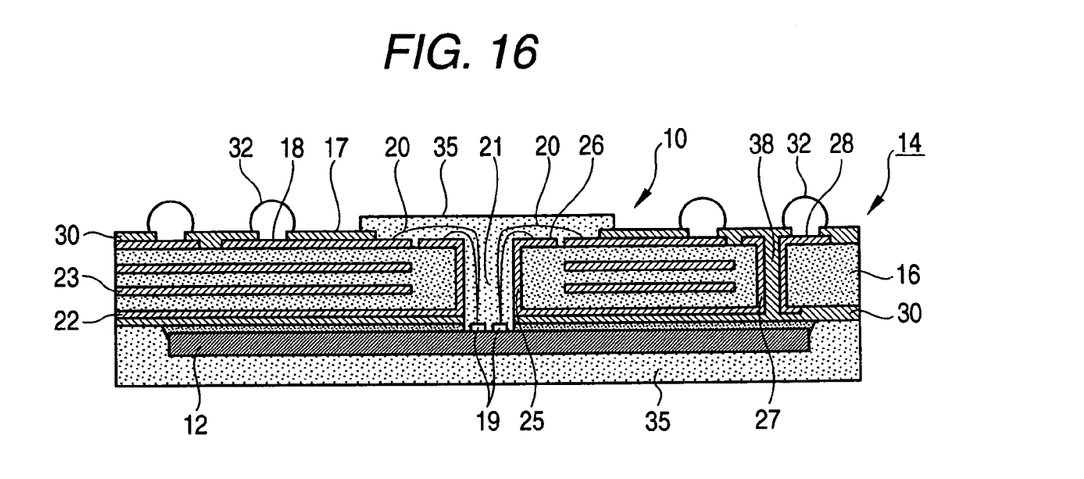
FIG. 16 is an explanatory cross-sectional view illustrating a semiconductor device according to a third embodiment.
Figure 17:
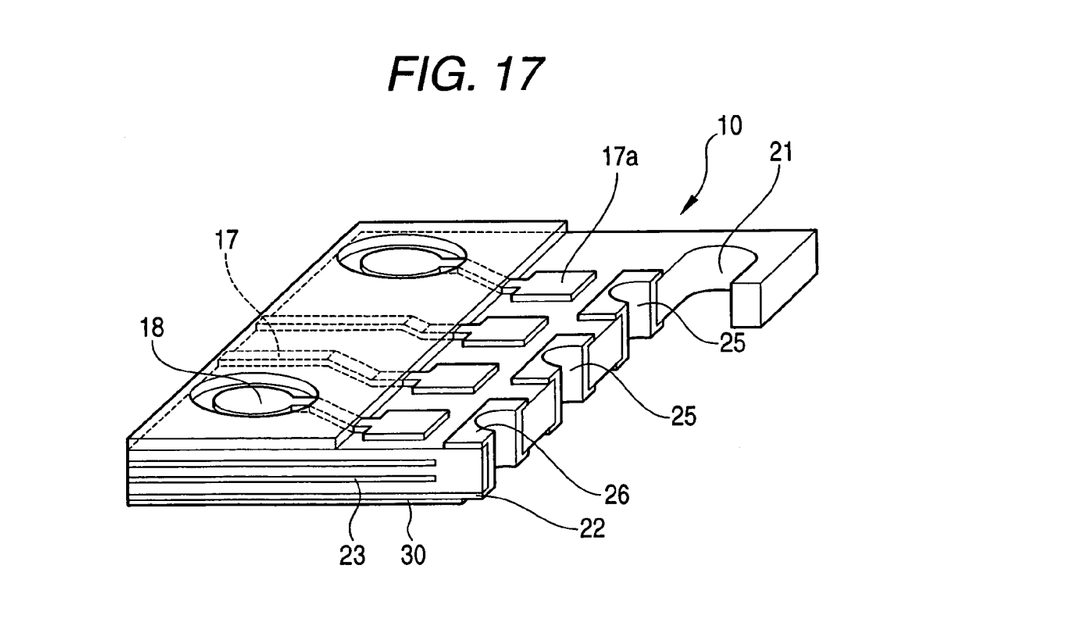
FIG. 17 is a partially cut away perspective view illustrating a semiconductor device package according to a third embodiment.

FIG. 16 is a schematic explanatory cross-sectional view illustrating a semiconductor device 14 according to a third embodiment of the invention. FIG. 17 is a partially cut away perspective view of a semiconductor device package 10 according to the third embodiment of the invention. The same members as those of the first embodiment are designated by the same reference numerals.

In the package 10 according to the third embodiment, the ground plane 22 is provided on the back surface of the board 16 as shown in FIG. 16. The connecting conductor portions 25 formed on the inner wall surface of the opening portion 21 are electrically connected to the ground plane 22. Also, the second external connection portion 28 is electrically connected to the ground plane 22 through the through-hole conductor portion 27.

In FIGS. 16 and 17, the power plane 23 is provided in the internal layer of the board 16. Although not shown, the power plane 23 is electrically connected to the connecting conductor portion 25 provided at another part of the inner wall surface of the opening portion 21, and also electrically connected to the second external connection portion 28 provided at another part.

Instead of the ground plane 22, the power plane 23 may be provided on the back surface of the board 16. In this case, the ground plane 22 may be formed in the internal layer of the board 16.

A method of manufacturing the package 10 according to the third embodiment is similar to that according to the first embodiment as shown in FIGS. 3A to 9B. Here, the multilayer resin board 16 is formed or prepared, which at least has the conductor layers 36 provided on the sides of the front surface layer and the back surface layer. The multilayer resin board 16 may include one of the ground plane 22 and the power plane 23 as the internal layer. Also, the multilayer resin board 16 may include a wiring layer.

In this case, in FIGS. 6A and 6B, etching is performed on only the plating film 40 and the conductor layer 36 provided on the side of the front surface layer of the board 16 in the photolithography process. The plating film 40 and the conductor layer 36 provided on the side of the back surface layer of the board 16 is left as the ground plane 22 or the power plane 23. Thus, the package 10 according to the third embodiment can be obtained.

Figure 18:
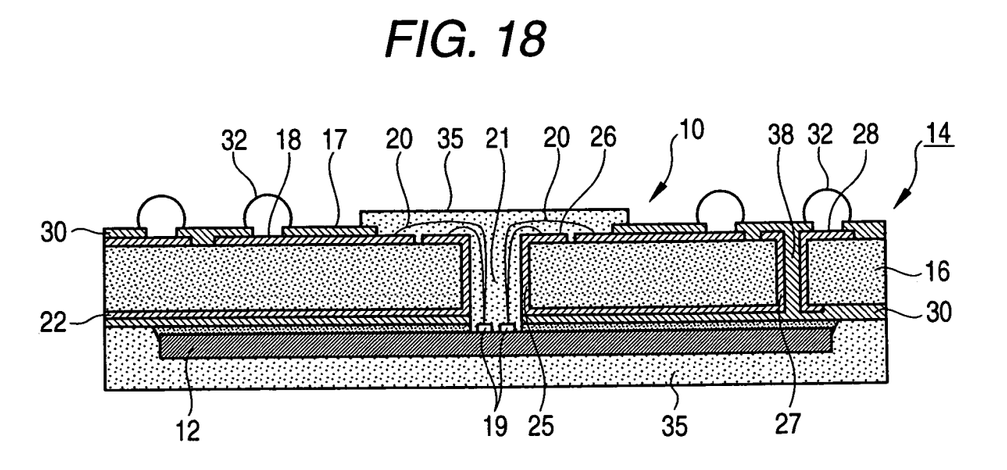
FIG. 18 is an explanatory cross-sectional view illustrating a semiconductor device according to a fourth embodiment.
Figure 19:
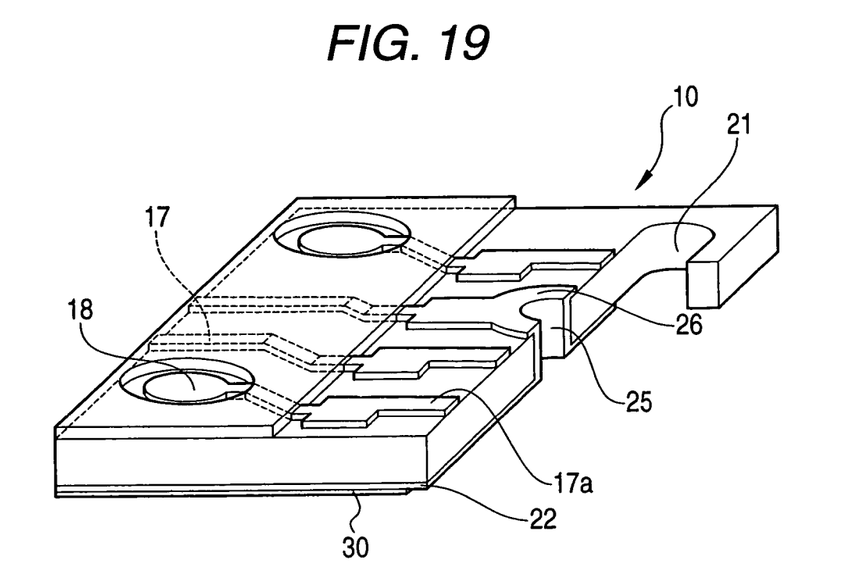
FIG. 19 is a partially cut away perspective view illustrating a semiconductor device package according to a fourth embodiment.

FIG. 18 is a schematic explanatory cross-sectional view illustrating a semiconductor device 14 according to a fourth embodiment of the invention. FIG. 19 is a partially cut away perspective view of a semiconductor device package 10 according to the fourth embodiment of the invention. The same members as those of the first embodiment are designated by the same reference numerals.

In the package 10 according to the fourth embodiment, the ground plane 22 is provided on the back surface of the board 16 as shown in FIG. 18. The connecting conductor portion 25 formed on the inner wall surface of the opening portion 21 is electrically connected to the ground plane 22. Also, the second external connection portion 28 is electrically connected to the ground plane 22 through the through-hole conductor portion 27.

In FIGS. 18 and 19, neither the power plane 23 nor the wiring layer is provided in the internal layer of the board 16. The board 16 is provided with the layer having the wiring pattern 17 and the layer for the ground plane 22 on the sides of the front surface layer and the back surface layer, respectively.

Instead of the ground plane 22, the power plane 23 may be provided on the back surface of the board 16. In this case, the board 16 is provided with the layer having the wiring pattern 17 and the layer for the power plane 23 on the sides of the front surface layer and the back surface layer, respectively.

A method of manufacturing the package 10 according to the fourth embodiment is similar to that according to the first embodiment as shown in FIGS. 3A to 9B. Here, the resin board 16 is formed or prepared, which has the conductor layers 36 provided on the sides of the front surface layer and the back surface layer.

In this case, in FIGS. 6A and 6B, etching is performed on only the plating film 40 and the conductor layer 36 provided on the side of the front surface layer of the board 16 in the photolithography process. The plating film 40 and the conductor layer 36 provided on the side of the back surface layer of the board 16 is left as the ground plane 22 or the power plane 23. Thus, the package 10 according to the fourth embodiment can be obtained.

Figure 20:
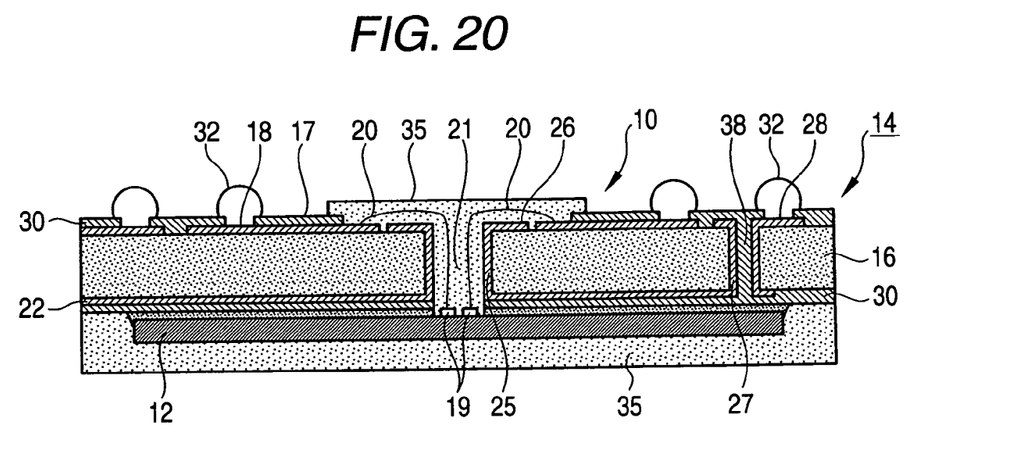
FIG. 20 is an explanatory cross-sectional view illustrating a semiconductor device according to a fifth embodiment.
Figure 21:
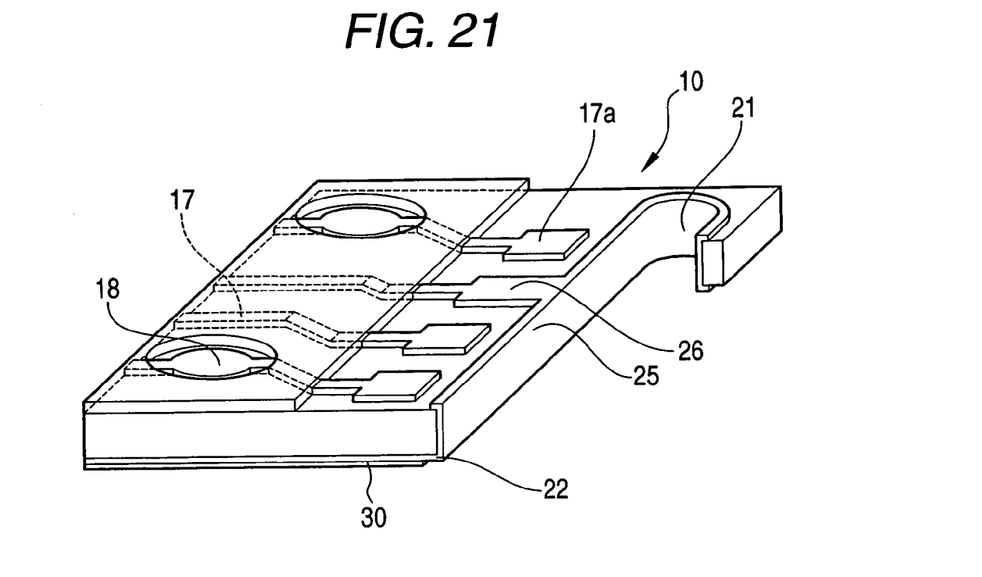
FIG. 21 is a partially cut away perspective view illustrating a semiconductor device package according to a fifth embodiment.

FIG. 20 is a schematic explanatory cross-sectional view illustrating a semiconductor device 14 according to a fifth embodiment of the invention. FIG. 21 is a partially cut away perspective view of a semiconductor device package 10 according to the fifth embodiment of the invention. The same members as those of the first embodiment are designated by the same reference numerals.

In the package 10 according to the fifth embodiment, the ground plane 22 is provided on the back surface of the board 16 as shown in FIG. 20. The connecting conductor portion 25 formed on the inner wall surface of the opening portion 21 is electrically connected to the ground plane 22. Also, the second external connection portion 28 is electrically connected to the ground plane 22 through the through-hole conductor portion 27. In this case, the connecting conductor portion 25 is not divided into a plurality of the conductor portions 25 (the concave grooves 41 are not formed).

In FIGS. 20 and 21, neither the power plane 23 nor a wiring layer is provided in the internal layer of the board 16. The board 16 is provided with the layer having the wiring pattern 17 and the layer for the ground plane 22 on the sides of the front surface layer and the back surface layer, respectively.

Instead of the ground plane 22, the power plane 23 may be provided on the back surface of the board 16. In this case, the board 16 is provided with the layer having the wiring pattern 17 and the layer for the power plane 23 on the sides of the front surface layer and the back surface layer, respectively.

A method of manufacturing the package 10 according to the fifth embodiment is similar to that according to the second embodiment as shown in FIGS. 11A to 15B. Here, the resin board 16 is formed or prepared, which has the conductor layers 36 provided on the sides of the front surface layer and the back surface layer.

In this case, in FIGS. 13A and 13B, etching is performed on only the plating film 40 and the conductor layer 36 provided on the side of the front surface layer of the board 16 in the photolithography process. The plating film 40 and the conductor layer 36 provided on the side of the back surface layer of the board 16 is left as the ground plane 22 or the power plane 23.

Further, the step described in FIGS. 14A and 14B is omitted. The inner wall of the opening portion 21 is not cut. The conductor portion 25 formed on the inner wall of the opening portion 21 is not divided into a plurality of the conductor portions 25 which are separate from each other. Thus, the package 10 according to the fifth embodiment can be obtained.

In the package 10 shown in FIGS. 20 and 21, the resin board 16 only has the conductor layers 36 provided on the sides of the front surface layer and the back surface layer. However, the resin board 16 may be used which includes one of the ground plane 22 and the power plane 23 as the internal layer. Also, the resin board 16 may include the wiring layer as the internal layer. The package 10 in which the connecting conductor portion 25 is not divided into a plurality of the conductor portions 25 can also be obtained by using the resin board 16 having the internal layer as described above.

Incidentally, in the description of each of the embodiments, an example of manufacturing one package 10 is described. Actually, a plurality of the packages 10 is fabricated in a board 16 for multiple devices. The semiconductor chip 12 is mounted on each package 10, and necessary steps such as wire bonding and resin-sealing are performed. Subsequently, the packages are cut and separated into individual semiconductor devices.

According to the semiconductor device package and the semiconductor device of the embodiments of the invention, the ground plane and/or the power plane is provided in the internal layer or the back surface side of the board. Thus, the speeding-up of signal propagation can be achieved. Also, at least one connecting conductor portion which is electrically connected to the corresponding ground plane and/or the power plane is provided in the inner wall surface of the opening portion. Additionally, at least one bonding pattern connected to the connecting conductor portion is provided on the front surface layer portion of the board in the vicinity of the edge of the opening portion. Thus, it is unnecessary to provide a wiring pattern for grounding and/or the power supply on the front surface layer portion of the board, and a wiring density for signals can be enhanced. Moreover, a path for the grounding and/or the power supply can be shortened. Also, are turn current of the signal can be supplied to the ground plane and/or the power plane. Consequently, characteristic impedance of the wiring portion on the board can easily be controlled, and electrical characteristics can be improved.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A semiconductor device package, comprising:
a board including at least one of a ground plane and a power plane;
a wiring pattern which is formed on a side of a front surface of the board;
a first external connection portion connecting the wiring pattern externally which is formed on the front surface side of the board;
an opening portion formed in the board;
at least one connecting conductor portion which is formed on an inner wall of the opening portion, and electrically connected to the corresponding one of said at least one of the ground plane and the power plane;
at least one bonding pattern which is formed on the front surface side of the board, and connected to the corresponding connecting conductor portion;
a second external connection portion which is formed on the front surface side of the board, and electrically connected to the corresponding one of said at least one of the ground plane and the power plane through a through-hole conductor portion formed in the board;
a semiconductor chip mounted on a side of a back surface of the board, the semiconductor chip having a first terminal portion and a second terminal portion both facing the opening portion;
a first wire for electrically connecting the wiring pattern and the first terminal portion through the opening portion; and
a second wire for electrically connecting the bonding pattern and the second terminal portion through the opening portion.

2. The semiconductor device package according to claim 1, further comprising: a concave groove formed in the inner wall of the opening portion, wherein the connecting conductor portion is formed on a wall surface of the concave groove.

3. The semiconductor device package according to claim 1, further comprising: bumps formed on the first external connection portion and the second external connection portion.

4. The semiconductor device package according to claim 1, wherein said at least one of the ground plane and the power plane is formed in an internal layer of the board.

5. The semiconductor device package according to claim 1, wherein one of the ground plane and the power plane is formed on a side of a back surface of the board.

6. The semiconductor device package according to claim 1, further comprising: a concave groove formed in the inner wall of the opening portion, wherein the connecting conductor portion is formed on the inner wall of the opening portion where the concave groove is not formed.

7. The semiconductor device package according to claim 1, wherein said at least one connecting conductor portion comprises a plurality of connecting conductor portions respectively and electrically connected to the corresponding one of said at least one of the ground plane and the power plane.

8. The semiconductor device package according to claim 1, wherein the semiconductor chip, the first wire and the second wire are sealed with a sealing resin.

* * * * *